United States Patent
Creekmore et al.

(10) Patent No.: US 6,924,437 B1
(45) Date of Patent: Aug. 2, 2005

(54) TECHNIQUES FOR COUPLING AN OBJECT TO A CIRCUIT BOARD USING A SURFACE MOUNT COUPLING DEVICE

(75) Inventors: Norman L. Creekmore, Raleigh, NC (US); Kevin F. Casey, Cary, NC (US); Troy Williams Glover, Raleigh, NC (US); Robert Gregory Twiss, Chapel Hill, NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/411,022

(22) Filed: Apr. 10, 2003

(51) Int. Cl.$^7$ .............................. H05K 1/16; H01B 7/40
(52) U.S. Cl. .................. 174/138 G; 361/804; 361/809; 361/810; 361/826; 361/827; 174/72 A
(58) Field of Search ........................ 174/138 D, 138 G, 174/72 A; 361/770, 804, 803, 740, 742, 807–810, 825–827

(56) References Cited

U.S. PATENT DOCUMENTS

| | | | | |
|---|---|---|---|---|
| 5,380,211 A | * | 1/1995 | Kawaguchi et al. ........... | 439/74 |
| 5,764,498 A | * | 6/1998 | Sundstrom ................... | 361/809 |
| 5,786,989 A | * | 7/1998 | Kawabe ....................... | 361/759 |
| 5,949,020 A | * | 9/1999 | Mitchell et al. ......... | 174/40 CC |
| 5,969,952 A | * | 10/1999 | Hayashi et al. ............. | 361/774 |
| 5,984,692 A | * | 11/1999 | Kumagai et al. ............. | 439/66 |
| 6,442,036 B2 | * | 8/2002 | Komatsu ..................... | 361/758 |
| 6,445,588 B1 | * | 9/2002 | Masterton et al. .......... | 361/759 |
| 6,479,758 B1 | * | 11/2002 | Arima et al. ................ | 174/260 |
| 6,525,266 B2 | | 2/2003 | Ferland et al. ......... | 174/35 GC |
| 6,545,868 B1 | | 4/2003 | Kledzik et al. ............. | 361/704 |
| 6,575,783 B1 | | 6/2003 | Wu ......................... | 439/540.1 |
| 6,667,885 B2 | | 12/2003 | Malone et al. ............. | 361/700 |
| 2003/0085056 A1 | * | 5/2003 | Goldstein et al. ........... | 174/260 |

OTHER PUBLICATIONS

Machinery's Handbook (26th Edition), by Oberg et al., Industrial Press Inc., publ. 2000, pp. 525 and 539.*

* cited by examiner

*Primary Examiner*—John B. Vigushin
(74) *Attorney, Agent, or Firm*—Chapin & Huang, LLC; David E. Huang, Esq.

(57) ABSTRACT

A circuit board assembly includes a circuit board which defines circuit board pads, a set of surface mount electronic components soldered to a first set of the circuit board pads using a surface mount soldering process, and a set of surface mount coupling devices soldered to a second set of the circuit board pads using the surface mount soldering process. Each surface mount coupling device is configured to couple at least a portion of an object to the circuit board. Each surface mount coupling device includes a set of surface mount pads connected to the second set of the circuit board pads by solder joints resulting from the surface mount soldering process, a set of legs extending from the set of surface mount pads, and a body portion connected to the set of legs, the body portion providing a fixed structure relative to the circuit board for securing the object.

19 Claims, 8 Drawing Sheets

TECHNIQUES FOR COUPLING AN OBJECT TO A CIRCUIT BOARD USING A SURFACE MOUNT COUPLING DEVICE

BACKGROUND OF THE INVENTION

A typical non-populated circuit board includes layers of conductive material (e.g., copper) and non-conductive material (e.g., Fiberglass) sandwiched together. The conductive material defines component mounting locations (e.g., surface mount pads, plated-through holes, etc.) and a network of electrical pathways (e.g., power signal planes, ground signal planes, individual traces, differential pair signal traces, etc.). The non-conductive material insulates the electrical pathways from each other as well as provides rigidity to protect and structurally support the electrical pathways.

There are a variety of approaches to mounting circuit board components to a circuit board. For example, for electronic components that require precise connection to mounting locations formed by sets of circuit board contacts (i.e., surface mount pads, plated-through holes, etc.), the circuit board manufacturer can solder the electronic components to the mounting locations using a soldering process. In one conventional soldering process, the circuit board manufacturer positions the circuit boards such that the sides to be populated face up, prints solder paste over sets of surface mount pads, places electronic surface mount components over the surface mount pads and in contact with the printed solder paste (e.g., using automated equipment which picks and places individual resistors, capacitors and diodes, Ball Grid Array components, etc.), and applies heat to activate flux and to melt solder within the solder paste. As a result, solder joints form between surface mount contacts of the electronic surface mount components and the mounting locations of the circuit board. This process may be repeated on the opposite side of the circuit board in order to utilize space on both sides of the circuit board.

As another example, for items that are generally bulky or cumbersome such as fiber optic cables and daughter cards, the circuit board manufacturer typically provides mounting holes through the circuit boards, and attaches the items using hardware which fastens to the circuit boards through the mounting holes. For example, to secure a fiber optic cable (or light pipe) to a circuit board, the manufacturer typically designs "keep-out" regions at particular locations within the circuit board (i.e., regions that do not contain any conductive material), drills holes through these "keep-out" regions to form mounting holes, and uses nuts and bolts to mount clips to the circuit board through these mounting holes. Accordingly, when the circuit board is ready for operation within an electronic system (e.g., at an installation site), a technician can easily secure the fiber optic cable to the circuit board by simply inserting portions of the cable into the mounted clips. Similarly, to secure a daughter card to a circuit board, the manufacturer forms mounting holes through the circuit board, and fastens the daughter card to the circuit board using hardware through the mounting holes (e.g., nuts and bolts, standoffs, L-shaped brackets, etc.).

SUMMARY

Unfortunately there are deficiencies to the above-described conventional approach to mounting items to circuit boards using mounting holes. For example, when circuit board designers configure circuit boards with mounting holes, the designers must design "keep-out" or "anti-pad" regions within the circuit boards (i.e., regions with no conductive material) which disrupts circuit board routing at every layer. In particular, the designers need to provide enough clearance to accommodate the actual sizes of the hardware (e.g., the diameters of the bolts and screws), as well as enough additional clearance to avoid inadvertently exposing conductive material (e.g., a signal trace, a power signal plane, a ground signal plane, etc.) when the mounting holes are drilled.

Additionally, when a circuit board designer places mounting holes near electronic components, the mounting holes may interfere with the circuit board designer's ability to locate signal traces (e.g., a bus or other critical routing feature) leading to and from these electronic components. For example, when a designer places a mounting hole adjacent to a mounting location for a high density IC package (e.g., a BGA component) with hundreds of signal traces leading to and from the mounting location, the placement of the mounting hole may over-constrain the mounting location thus necessitating the addition of another signal layer or the use of external wires. Both of these alternatives increases the design and manufacturing costs of the circuit board.

Furthermore, in many situations, the placement of mounting holes within a circuit board design may prevent auto-routing (i.e., automatic positioning of signal traces in a circuit board design by software). In such situations, a circuit board designer must intervene and manually "hand-route" traces around the mounting holes, or perhaps lower certain circuit board standards in certain critical areas if particular circuit board manufacturing rules are too difficult or impossible to comply with (e.g., decrease minimum trace separation distances, allow sharper trace angles, etc.) thus increasing the cost of designing the circuit boards as well as jeopardizing the quality and proper functionality of the circuit boards.

Embodiments of the invention are directed to techniques for coupling an object to a circuit board using a surface mount coupling device. Use of the surface mount coupling device alleviates the need for putting mounting holes through the circuit board. Rather, the surface mount coupling device is capable of simply soldering to the circuit board surface using a surface mount soldering process, and subsequently securing the object to the circuit board. Accordingly, the use of such a coupling device tends not to disrupt circuit board routing as in conventional mounting approaches which use mounting holes, and tends not to over-constrain areas around electronic component mounting locations.

One embodiment of the invention is directed to a circuit board assembly which includes a circuit board which defines circuit board pads, a set of surface mount electronic components soldered to a first set of the circuit board pads using a surface mount soldering process, and a set of surface mount coupling devices (i.e., one or more coupling devices) soldered to a second set of the circuit board pads using the surface mount soldering process. Each surface mount coupling device is configured to couple at least a portion of an object (e.g., a fiber optic cable, a lightpipe, a daughter card, etc.) to the circuit board. Each surface mount coupling device includes (i) a set of surface mount pads connected to the second set of the circuit board pads by solder joints resulting from the surface mount soldering process, (ii) a set of legs extending from the set of surface mount pads, and (iii) a body portion connected to the set of legs, the body portion providing a fixed structure relative to the circuit board for securing the object. The set of surface mount coupling devices alleviates the need for mounting holes.

Accordingly, the circuit board designer can run traces through the circuit board without being constrained by "keep-out" or "anti-pad" regions associated with such mounting holes (e.g., traces can run through the circuit board underneath the set of surface mount coupling devices).

In some arrangements, the body portion of each surface mount coupling device defines a substantially round socket, and each surface mount coupling device further includes an engaging member which is configured to engage the body portion of that surface mount coupling device through the socket. The engaging member is preferably configured to accommodate a particular geometry of the object for robust coupling. For example, in one arrangement, the engaging member is a clip-shaped structure which is well-suited for securing a fiber optic cable. In another arrangement, the engaging member is a screw or a standoff which is well-suited for supporting a daughter card. Accordingly, the design of the engaging member is flexible.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for coupling an object (e.g., a cable, a daughter card, etc.) to a circuit board using a surface mount coupling device. Use of the surface mount coupling device alleviates the need for putting mounting holes through the circuit board. Rather, the coupling device is capable of simply soldering to the circuit board surface using a surface mount soldering process, and subsequently securing the object to the circuit board. Accordingly, the use of such a coupling device tends not to disrupt circuit board routing as in conventional mounting approaches which use mounting holes and, if the surface mount coupling device is used adjacent to a high density mounting location, tends not to over-constrain the area around that mounting location.

Figure 1:
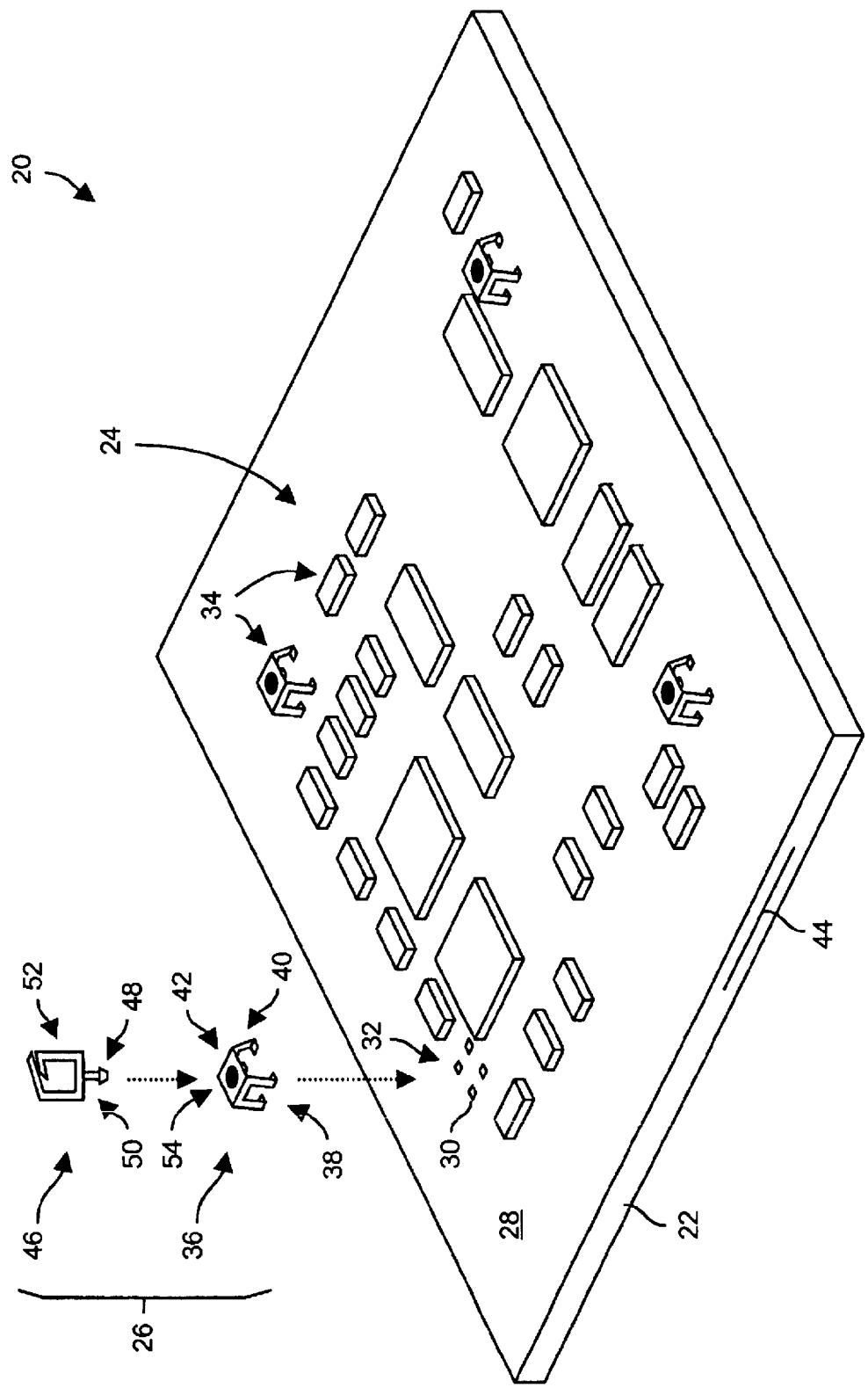
FIG. 1 is a general perspective view of a circuit board assembly which is suitable for use by the invention.

FIG. 1 shows a circuit board assembly 20 which is suitable for use by the invention. The circuit board assembly 20 includes a circuit board 22, a set of surface mount electronic components 24, and a set of surface mount coupling devices 26. In some arrangements, the circuit board assembly 20 includes only one surface mount coupling device 26. However, by way of example only and as shown in FIG. 1, the circuit board assembly 20 includes multiple surface mount coupling devices 26 distributed around the circuit board 22.

As shown in FIG. 1, the circuit board 22 includes, among other things, a surface 28 having surface mount circuit board pads 30. The electronic components 24 and the surface mount coupling devices 26 fasten to mounting locations 32 defined by these circuit board pads 30 by way of solder joints 34 formed during a surface mount soldering process (e.g., a reflow soldering process in which solder from printed solder paste melts to form the solder joints 34 between the coupling devices 26 and the circuit board pads 30).

One of the surface mount coupling devices 26 is shown in an exploded orientation relative to the circuit board 22 to better illustrate particular details of the coupling device 26. However, it should be understood that embodiments of the invention are capable of being implemented by standard surface mounting automated equipment with little or no difficulty so that all of the electronic components 24 and all of the surface mount coupling devices 26 simultaneously solder to the surface 28 of the circuit board 22. In particular, the electronic components 24 solder to a first set of the circuit board pads 30, and the surface mount coupling devices 26 (or at least portions of the coupling devices 26) concurrently solder to a second set of the circuit board pads 30. In some arrangements, this process is performed before or after another soldering process which populates the opposite side of the circuit board 22 so that both sides of the circuit board 22 are utilized.

It should be further understood that the surface mount coupling devices 26 (or portions thereof) are well-suited for being handled by standard pick-and-place equipment. That is, the same automated equipment, which picks the electronic components 24 out of their supply carriers and places the electronic components 24 onto the circuit board 22 and in contact with printed solder paste, is capable of picking and placing the coupling devices 26. Accordingly, significant redesigning or retooling of the circuit board manufacturing process is unnecessary when installing the coupling devices 26 using standard circuit board manufacturing equipment. Therefore, use of the coupling devices 26 is cost effective, and no new circuit board fabrication technology is required.

As further shown in FIG. 1, each surface mount coupling device 26 includes a bottom member 36 having a general platform shape. In particular, the bottom member 36 includes a set of surface mount pads 38 which is configured to solder to the circuit board pads 30, a set of legs 40 extending from the set of surface mount pads 38, and a body portion 42 connected to the set of legs 40. The body portion 42 provides a fixed structure relative to the circuit board 22 for securing an object. As shown in FIG. 1, the coupling devices 26 require very little circuit board real estate and alleviate the need for mounting holes.

In some arrangements, the bottom member 36 includes exactly four legs 40 and exactly four surface mount pads 38. This provides stability for the coupling device 26 and distributes the holding force among multiple solder joints 34 for steady and stable mounting. In these arrangements, the legs 40 preferably flare out from the body portion 42 at an angle that is slightly greater than 90 degrees (e.g., in an A-frame manner as shown in FIG. 1) for additional strength. The body portion 42 is generally rectangular in shape and preferably is slightly smaller than the footprint defined by the surface mount pads 38 for enhanced stability.

In some arrangements, the set of surface mount pads 38, the set of legs 40, and the body portion 42 are integral with each other. That is, these portions 38, 40, 42 are formed from a single, cut and shaped piece of sheet metal stock thus providing a cohesive, unitary element. In these arrangements, each surface mount pad 38 is relatively planar in shape (i.e., has a flat bottom surface) and well-suited for robustly soldering to a flat circuit board pad 30. These arrangements provide a low cost and simple approach to manufacturing the surface mount coupling devices 26 (e.g., stamping and bending metal stock). In certain arrangements, the metal includes tin (e.g., a tin plating) making the bottom member 36 readily solderable to the circuit board pads 30, i.e., so that tin-based solder easily wets between the surface mount pads 38 and the circuit board pads 30 to form a robust and reliable solder joint.

In some arrangements, the set of circuit board pads 30 electrically connects to other conductive material within the circuit board 22 such as a ground signal plane 44 (see FIG. 1), or alternatively a power signal plane or a signal trace. Accordingly, in these arrangements, when the bottom member 42 of the coupling device 26 solders to the mounting location defined by the set of circuit board pads 30, the bottom member 42 carries the same signal as the other conductive material (e.g., a ground signal for safety).

In some arrangements, the object attaches directly to the body portion 42 of the bottom member 36 (e.g., using hardware). In other arrangements, the surface mount coupling device 26 further includes an additional engaging member 46 (e.g., a clip member, a standoff, etc.), and the object attaches indirectly to the body portion 42 of the bottom member 36 through the engaging member 46. By way of example only, the engaging member 46 is shown in FIG. 1 as including a retaining portion 48, a shaft 50 and clip portion 52. The shaft 50 connects the retaining portion 48 to the clip portion 52. Furthermore, the shaft 50 enables the engaging member 46 to attach to the bottom member 36 by inserting through a socket 54 (e.g., a generally round hole, a threaded hole, etc.) defined by the body portion 42 of the bottom member 36. Once the shaft 50 is inserted through the socket 54 of the body portion 42, interference by the retaining portion 48 and the clip portion 52 holds the engaging member 46 to the bottom member 36. Accordingly, when the bottom member 36 is mounted to the circuit board surface 28 and when the engaging member 46 attaches to the bottom member 36 (see the dashed lines in FIG. 1), the coupling device 26 is well-suited for robustly coupling an object (e.g., a fiber optic cable) to the circuit board 22. In some arrangements, both the shaft 50 and the socket 54 are substantially round thus enabling the engaging member 46 to rotate relatively freely within the bottom member 36 for rotational stress relief about the axis which is perpendicular to the circuit board surface 28.

By way of example only, the body portion 42 defines the socket 54 to receive insertion of the shaft 48 in a direction that is substantially perpendicular to the surface 28 of the circuit board 22 (see the dashed line between the engaging member 46 and the bottom member 36). Such a configuration is well-suited for supporting the engaging member 46 further away from the circuit board surface 28, i.e., further above the raised platform surface of the body portion 42. Further details of the invention will now be provided with reference to FIG. 2.

Figure 2:
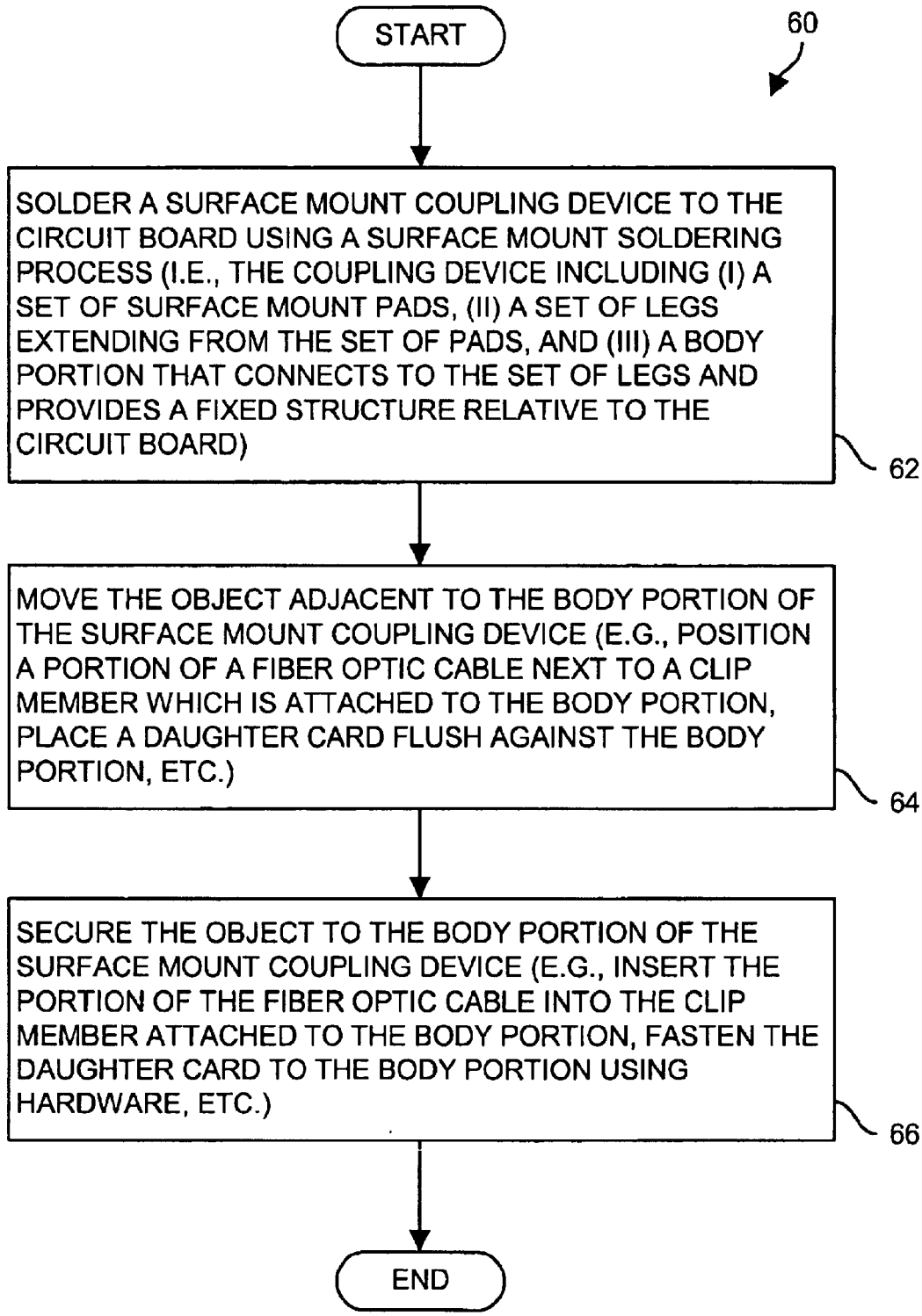
FIG. 2 is a flowchart of a procedure which is performed by a user of the circuit board assembly of FIG. 1.

FIG. 2 is a flowchart of a procedure 60 which is performed by a user of the circuit board assembly 20. In step 62, the user (e.g., for this step a circuit board manufacturer) solders a bottom member 36 of a surface mount coupling device 26 to the circuit board 22 using a surface mount soldering process (e.g., reflow soldering). As mentioned earlier, one suitable approach is to solder the bottom member 36 to the circuit board 22 while populating the circuit board 22 with the electronic components 24 using automated equipment. Another suitable approach is to solder the bottom member 36 to the circuit board after the circuit board 22 is populated (e.g., manually by a technician at a soldering station or at a rework station). Other approaches are suitable for use by the invention as well.

In step 64, the user moves the object (e.g., a cable, a daughter card, etc.) adjacent to the body portion 42 of the coupling device 26. For example, for a daughter card, the user can place the daughter card in direct contact with the body portion 42. As another example, for a cable, the user can install an engaging member 46 (e.g., a plastic or metallic clip-shaped element) onto the body portion 42 and then move a portion of the cable adjacent to the engaging member 46.

In step 66, the user secures the object to the body portion 42 of the coupling device 26. For example, the user fastens the daughter card to the body portion 42 using hardware such as a screw which passes through the daughter card and threads into the socket 54 (also see FIG. 1). As another example, the user pushes a portion of the cable through a slot in the engaging member 46 to retain the cable.

It should be understood that the above-described procedure 60 provides a cost-effective method for securing objects (e.g., mechanical items) to a circuit board without providing mounting holes through the circuit board. Without such mounting holes, there are less layout restrictions placed on the conductive features of the circuit board 22. Further details of the invention will now be provided with reference to FIGS. 3 through 8.

FIGS. 3 through 8 illustrate a variety of techniques for coupling objects to the circuit board 22 using the surface mount coupling device 26 of FIG. 1. These exemplary techniques are capable of being utilized individually or in combination depending on the type of object and the situation.

Figure 3:
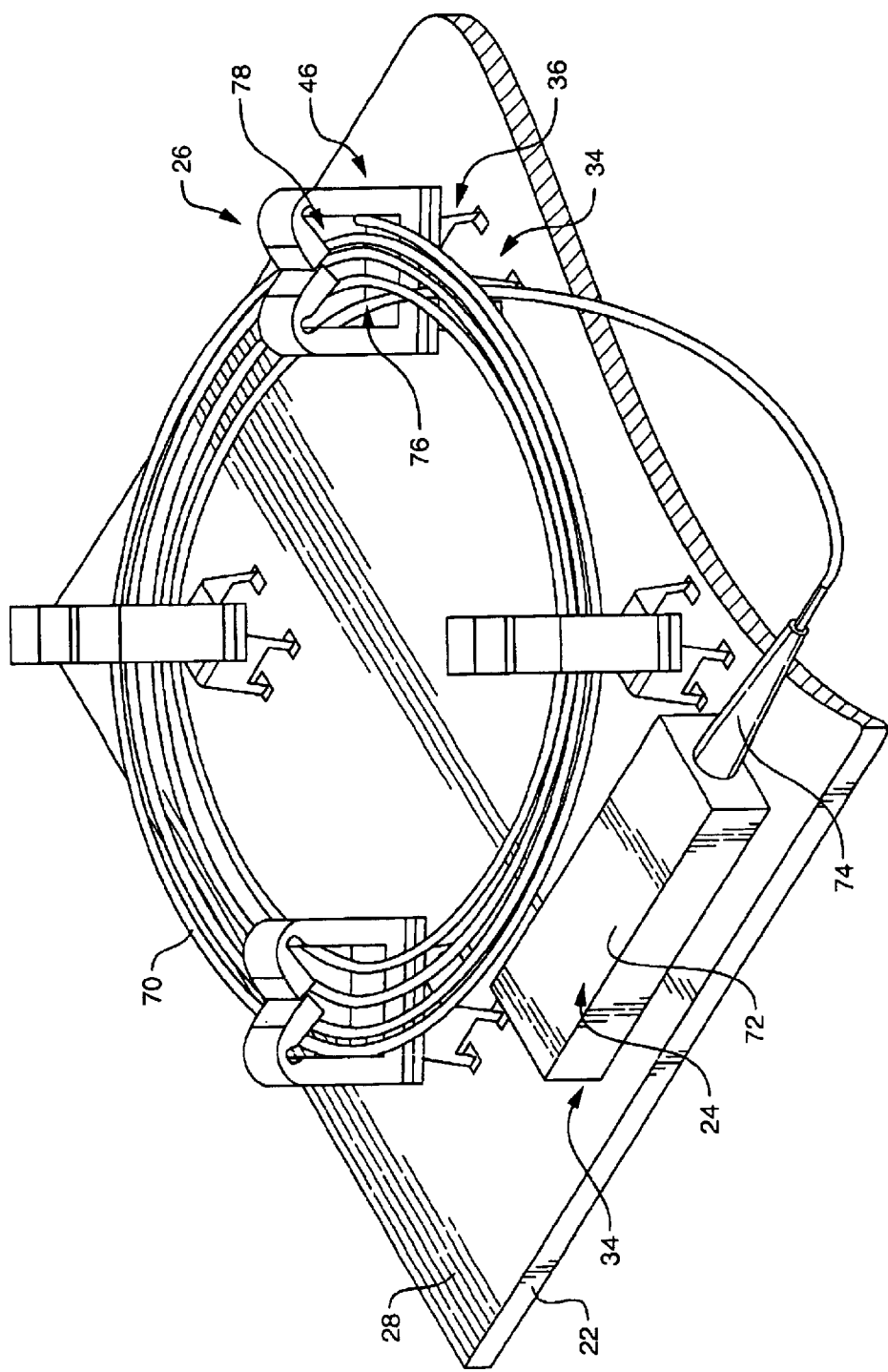
FIG. 3 is a perspective view of an exemplary arrangement for securing a fiber optic cable to a circuit board.

FIG. 3 shows a set of surface mount coupling devices 26 for coupling, as an object, a cable 70 to the circuit board 22. As shown in FIG. 3, the set of electronic components 24 includes an interface device 72.

As explained earlier in connection with FIG. 1, the bottom member 36 of each coupling device 26 rigidly attaches to the circuit board 22 via a set of solder joints 34 and provides a fixed structure relative to the circuit board 22 for supporting an engaging member 46 (e.g., also see the socket 54 in the bottom member 36 and the shaft 50 of the engaging member 46 in FIG. 1). The cable 70 has an end 74 which mates with the interface device 72. Portions 76 of the cable 70 insert into cavities 78 defined by the engaging members 46 thus securing the cable 70 to the circuit board 22. In one arrangement, the cable 70 includes a set of metal conductors which electrically couples to the interface device 72 (e.g., an electronic transmitter and/or receiver). In another arrangement, the cable 70 includes a set of optical fibers which exchange light energy with the interface device 72 (e.g., a fiber optic transducer).

It should be understood that the surface mounted coupling devices 26 robustly and reliably secure the cable 70 to the circuit board 22 without the need for putting any mounting holes through the circuit board 22. Accordingly, the use of such coupling devices 26 does not overly constrain conductive layers within the circuit board 22 as do conventional mounting holes.

Figure 4:
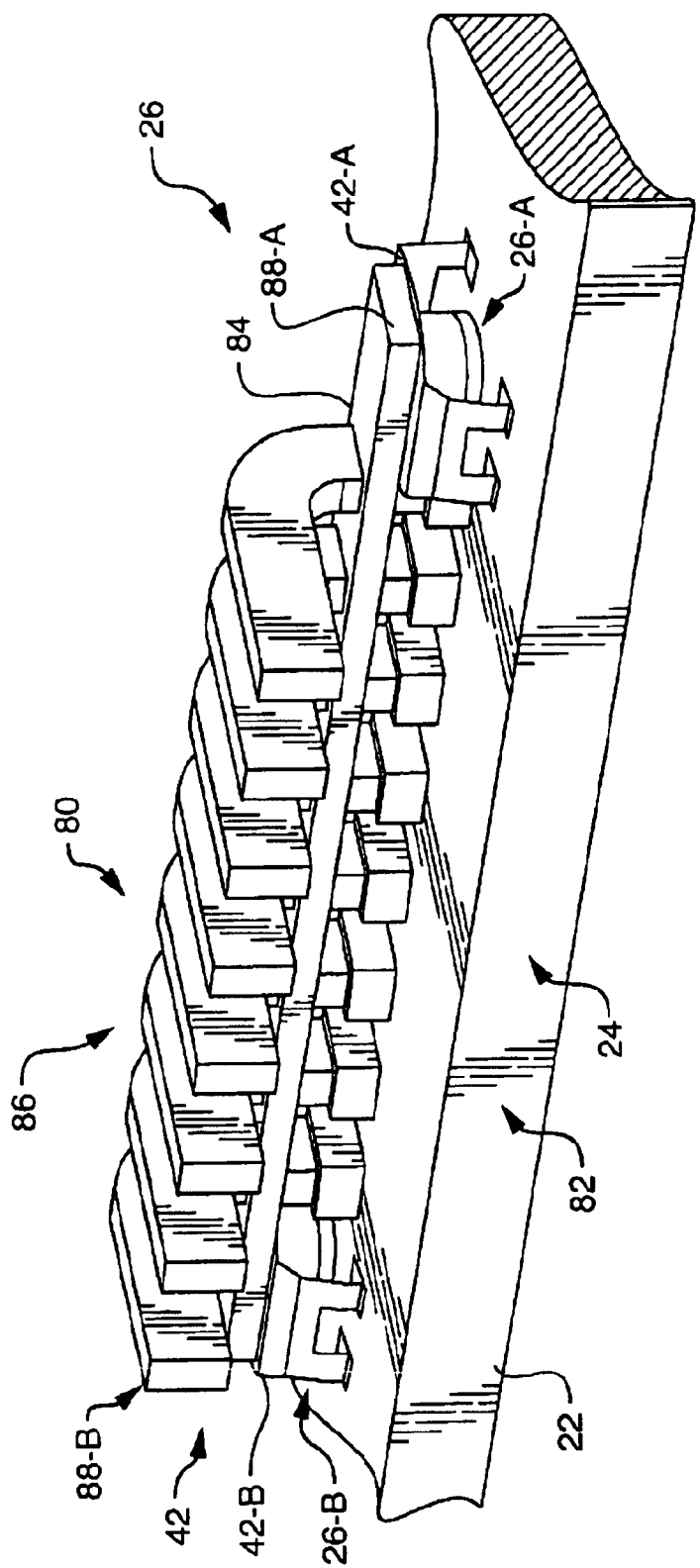
FIG. 4 is a perspective view of an exemplary arrangement for securing an array of lightpipes over light emitting diodes (LEDs) on a circuit board.

FIG. 4 shows a set of surface mount coupling devices 26 for coupling, as an object, an array of lightpipes 80 to the circuit board 22. In this example, the electronic components 24 include a set of light emitting diodes (LEDs) 82 which is configured to interface with the lightpipe array 80.

As shown, the lightpipe array 80 includes a frame (or carrier) 84 and a set of lightpipe elements 86, i.e., a tunnel of clear material (e.g., plastic) that receives light at one end from an LED and reflects the light internally so that the light can be seen at the other end (e.g., to convey a visible indication from the circuit board 22 to a front panel display). When the array 80 is properly mounted to the circuit board 22, lightpipe interfaces (i.e., the ends) of the lightpipe elements 86 precisely align with corresponding lenses of the LEDs 82.

To mount the array 80 to the circuit board 22, the frame 84 connects with a pair of surface mount coupling devices 26-A, 26-B soldered to the circuit board 22. By way of example only, one end 88-A of the frame 84 inserts through a socket 54 of one coupling device 26-A, and another end 88-B of the frame 84 inserts through a similar socket 54 of the other coupling device 26-B. The multiple coupling devices 26 help distribute connection forces and stresses across multiple solder joints 34. As a result, the array 80 is robustly and reliably connected to the circuit board 22.

Furthermore, the raised positioning of the body portions 42-A, 42-B of the coupling devices 26-A, 26-B over the circuit board surface 28 allows greater flexibility for the electronic components 24. For example, as shown in FIG. 4, the electronic components 24 (e.g., the LEDs 82) may reside immediately adjacent to or even underneath portions of the coupling device 26.

Figure 5:
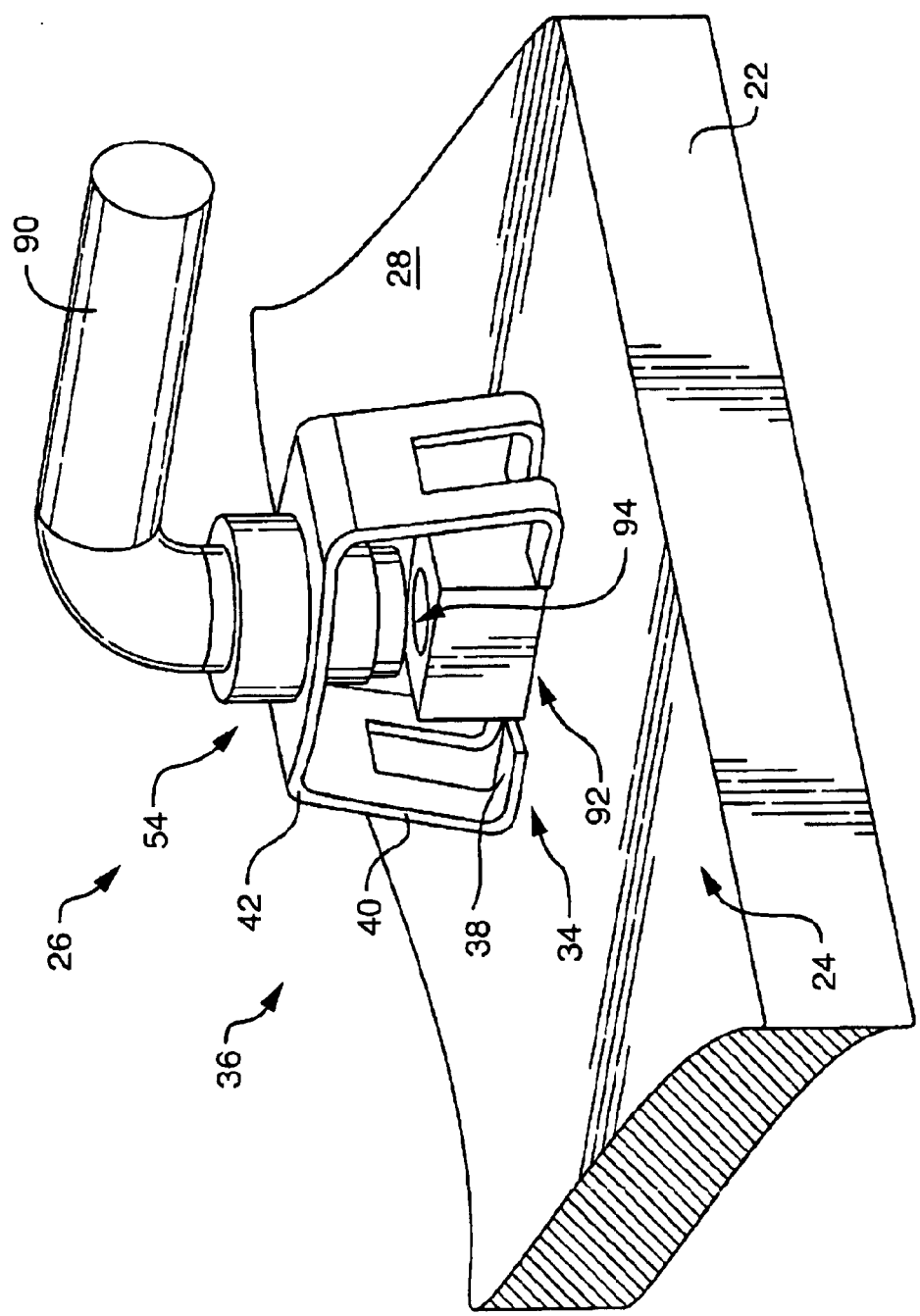
FIG. 5 is a perspective view of an exemplary arrangement for securing a single lightpipe over an LED on a circuit board.

FIG. 5 shows a single surface mount coupling device 26 for coupling, as an object, a single lightpipe element 90 to the circuit board 22. Here, the electronic components 24 include an LED 92 which is configured interface with the lightpipe element 90. As shown, an end 94 of the lightpipe element 90 extends through the socket 54 defined by the body portion 42 of the bottom member 36.

It should be understood that the coupling device 26 robustly and reliably positions the lightpipe element 90 relative to the LED 92 without the need for putting mounting holes through the circuit board 22. Accordingly, the use of such a coupling device 26 does not overly constrain conductive layers within the circuit board 22 as in a conventional mounting approach which uses mounting holes. Moreover, the raised positioning of the body portion 42 of the bottom member 36 over the circuit board surface 28 enables efficient and effective use of surface real estate as well. That is, the electronic components 24 (e.g., the transducer 92) may reside immediately adjacent to or even partially or fully underneath portions of the coupling device 26.

Figure 6:
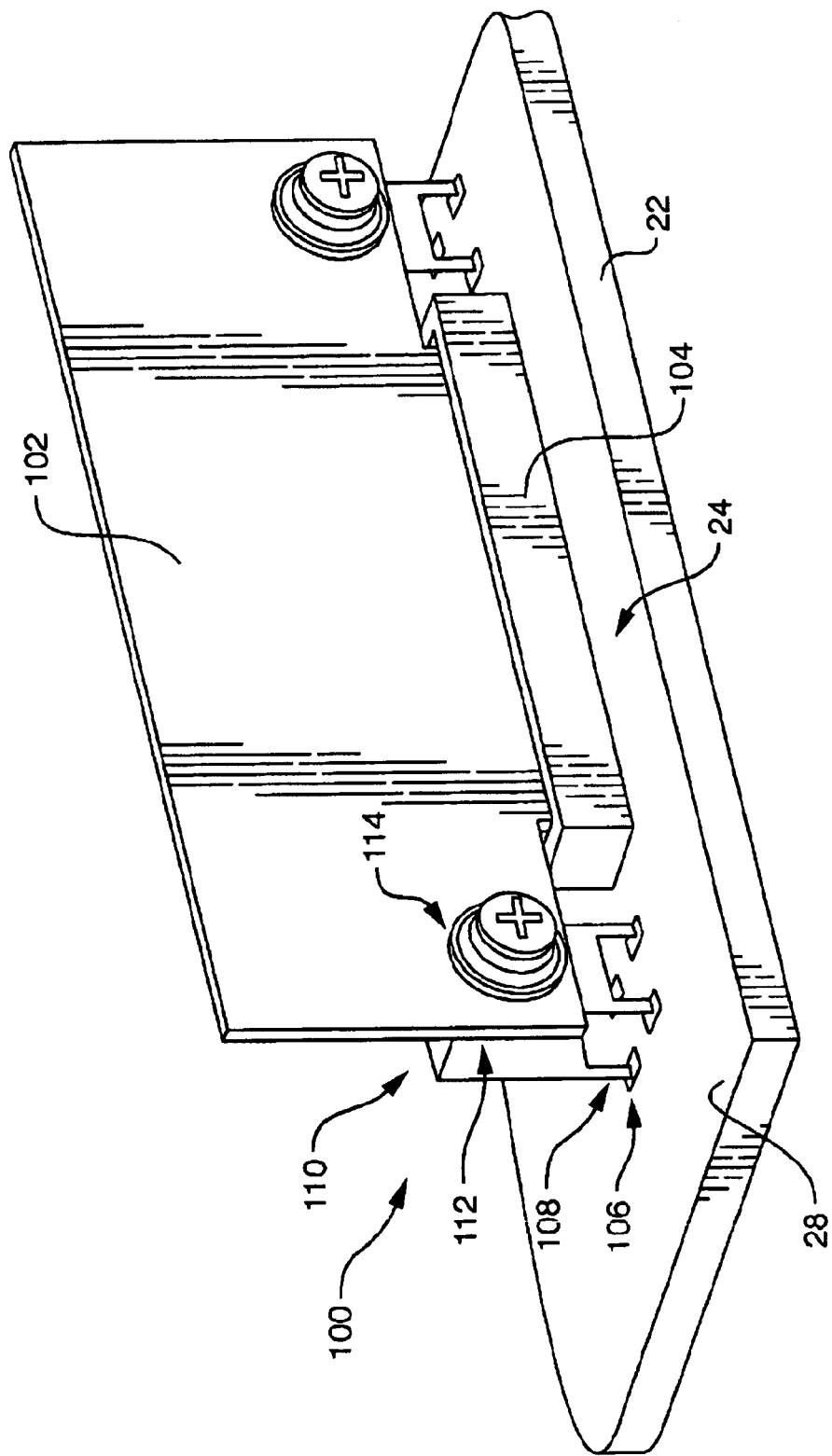
FIG. 6 is a perspective view of an exemplary arrangement for securing a daughter card to a circuit board in a substantially perpendicular manner.
Figure 7:
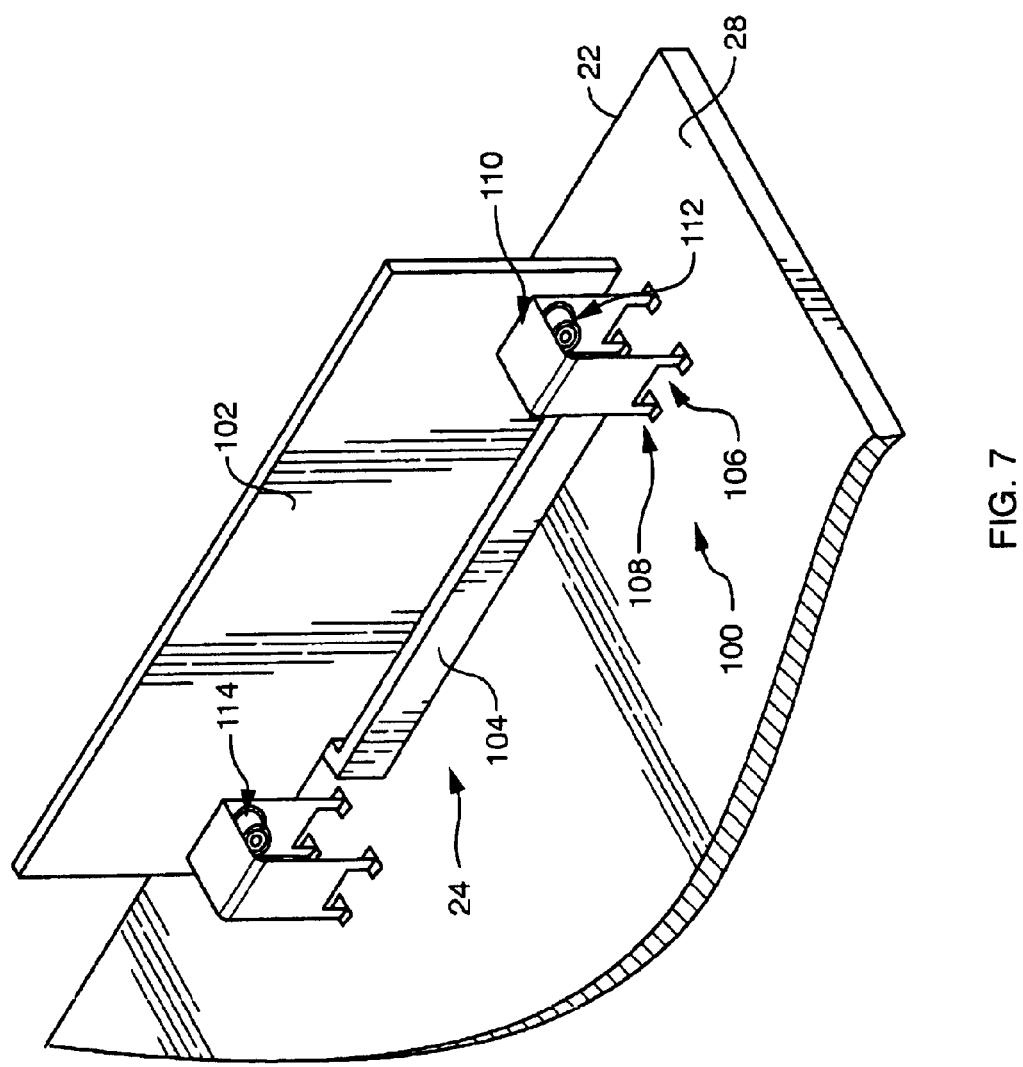
FIG. 7 is another perspective view of the exemplary arrangement of FIG. 6.

FIGS. 6 and 7 show a set of surface mount coupling devices 100 for coupling, as an object, a daughter card 102 (e.g., a memory expansion card) to the circuit board 22. FIG. 7 shows a somewhat reverse angle to that shown in FIG. 6. In this example, the electronic components 24 include a daughter card connector 104 which is configured interface with the daughter card 102.

The coupling devices 100 of FIGS. 6 and 7 are similar to the coupling devices 26 of FIG. 1. In particular, the coupling devices 100 include a set of surface mount pads 106, a set of legs 108 extending from the set of surface mount pads 106, and a body portion 10 connected to the set of legs 108. However, in contrast to the body portion 42 of FIG. 1 which is relatively planar in shape and substantially parallel to the circuit board surface 28, the body portion 110 of FIGS. 6 and 7 is folded and includes a portion that is substantially perpendicular to the circuit board surface 28 which defines a socket 112. This configuration is well-suited for supporting the daughter card 102 at an angle which is substantially perpendicular to the circuit board 22.

To install the daughter card 102, the daughter card 102 is simply inserted into the connector 104, and then mounted to the coupling devices 100 using hardware 114. As a result, there are no mounted holes needed within the circuit board 22 when securing the daughter card 102 to the circuit board 22.

Figure 8:
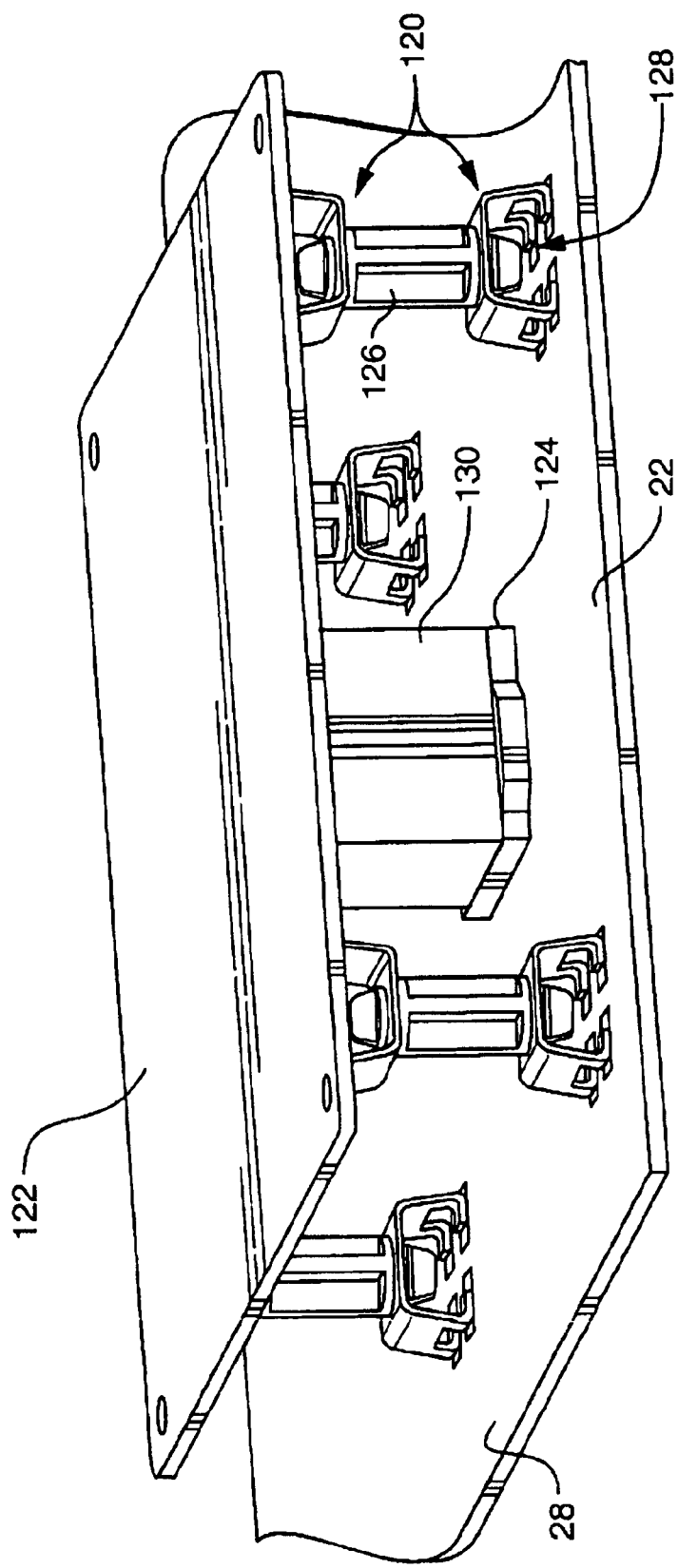
FIG. 8 is a perspective view of an exemplary arrangement for securing a daughter card to a circuit board in a substantially parallel manner.

FIG. 8 shows a set of surface mount coupling devices 120 for coupling, as an object, a daughter card 122 to the circuit board 22. The electronic components 24 include a daughter card connector 124 which is configured interface with the daughter card 102.

By way of example, the daughter card 122 includes a set of surface mount coupling devices 120 as well. The relative positioning of the coupling devices 120 on the circuit board 22 and on the daughter card 122 provides precise alignment for a set of standoffs 126 to extend therebetween. The standoffs 126 are capable of securing to the coupling devices 26 through sockets 128 defined therein in a similar manner to the sockets 54 described earlier in connection with the engaging member 46 and the bottom member 36. This configuration is particularly well-suited for holding the daughter card 122 so that it is substantially parallel to the circuit board 22.

To install the daughter card 122, the standoffs 126 are inserted into one set of coupling devices 120 (e.g., the coupling devices 120 of the circuit board 22). Next, the daughter card 122 is aligned such that a corresponding connector 130 on the daughter card 122 aligns with the connector 124 of the circuit board 22 and such that the sockets 128 of the other set of coupling devices 120 (e.g., of the coupling devices 120 of the daughter card 122) align with the standoffs 126. Then, the daughter card 122 and the circuit board are moved together so that the connectors 126, 124 mate, and so that the standoffs 126 are properly engaged with both sets of coupling devices 120. As a result, the coupling devices 120 provide proper separation and robustly support the daughter card 122 and the circuit board 22 in a substantially parallel manner.

As described above, embodiments of the invention are directed to techniques for coupling an object (e.g., a cable, a daughter card, etc.) to a circuit board 22 using a surface mount coupling device 26, 100, 120. Use of the surface mount coupling device 26, 100, 120 alleviates the need for putting mounting holes through the circuit board 22. Rather, the coupling device 26, 100, 120 is capable of simply soldering to the circuit board surface 28 using a surface mount soldering process, and subsequently securing the object to the circuit board 22. As a result, the use of such a coupling device 26, 100, 120 tends not to disrupt circuit board routing as in conventional mounting approaches which use mounting holes, and tends not to over-constrain areas around electronic component mounting locations.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the surface mount coupling devices 26, 100, 120 were described above as being well-suited for securing cables and daughter cards to the circuit board 22 by way of example only. The surface mount coupling devices 26, 100, 120 are well-suited for securing other types of objects as well such as heat sinks, test fixtures (e.g., a bed of nails), connectors, displays, input/output devices, wire routing clips, standoffs, clamps, and the like.

Additionally, it should be understood that the number of surface mount pads and legs for each coupling device 26, 100, 120 was described above as four by way of example only. In other arrangements, the number of pads and legs is a number other than four (e.g., one, two, six, etc.).

Furthermore, it should be understood that various enhancements can be added to the coupling devices 26. For example, holes can be provided within the legs to reduce the mass of the coupling devices 26, 100, 120 to improve solderability, and to provide better thermal relief.

Additionally, it should be understood that the body portions 42, 110 were described above as defining sockets 54, 112 for receiving either an additional member (see the engaging member 46 of FIG. 1) or hardware (see the hardware 114 of FIG. 6). It should be understood that the body portions 42, 110 are adaptable and are capable of being configured in a variety of manners to accommodate particular fastening schemes such as snap-fit, screws, rivets, friction-fit, and the like.

Furthermore, it should be understood that the bottom member 36 was described above as being all metal by way of example only. In other arrangements, the bottom member 36 is not all metal. For example, in some arrangements, the bottom member 36 is plastic with metal feet (i.e., with metallic surface mount pads 38). Other portions can be made of non-metal material as well such as the optional engaging member 46 (e.g., the engaging member 46 can be made of plastic). Essentially, the surface mount coupling device 26, 100, 120 can be made of any material or combination of materials that (i) enables the surface mount coupling devices 26, 100, 120 to mount to the circuit board using a surface mount soldering process and (ii) accomplishes mounting of an object (e.g., a relatively cumbersome or large mechanical device such as a cable or a daughter card) to a circuit board without requiring a mounting hole through the circuit board.

What is claimed is:

1. A surface mount coupling device for coupling an object to a circuit board, the surface mount coupling device comprising:

a set of surface mount pads which is configured to solder to the circuit board using a surface mount soldering process;

a set of legs extending from the set of surface mount pads; and a body portion connected to the set of legs, the body portion being substantially planar in shape and being raised above the set of surface mount pads by the set of legs to form a fixed structure for securing the object away from a surface of the circuit board when the set of surface mount pads is soldered to the circuit board using the surface mount soldering process;

wherein the set of leas includes exactly four legs which operate to position the body portion, which is substantially planar in shape, substantially parallel to the surface of the circuit board;

wherein each leg is integral with the body portion to form a cohesive, unitary member; and wherein each leg extends from the body portion in a substantially straight A-frame manner at an angle that is slightly greater than 90 degrees to provide enhanced stability to the body portion.

2. The surface mount coupling device of claim 1 wherein the set of legs and the body portion are integral with each other by being formed from a single, cut and shaped piece of sheet metal.

3. The surface mount coupling device of claim 1 wherein the set of surface mount pads, the set of legs, and the body portion are integral with each other by being formed from a single, cut and shaped piece of sheet metal.

4. The surface mount coupling device of claim 1 wherein the set of surface mount pads includes exactly four planar-shaped mounting pads.

5. The surface mount coupling device of claim 4 wherein the four planar-shaped mounting pads define a first substantially rectangular shape, and wherein the body portion defines a second substantially rectangular shape which is smaller than the first substantially rectangular shape defined by the four planar-shaped mounting pads.

6. The surface mount coupling device of claim 1 wherein the body portion defines a substantially round socket, and wherein the surface mount coupling device further comprises:

an engaging member which is configured to (i) engage with the body portion through the socket, and (ii) position the object.

7. The surface mount coupling device of claim 6 wherein, when the surface mount coupling device is soldered to the circuit board, the body portion defines the substantially round socket in a manner to receive the engaging member in a direction which is substantially perpendicular to a surface of the circuit board.

8. The surface mount coupling device of claim 6 wherein, when the surface mount coupling device is soldered to the circuit board, the body portion defines the substantially round socket in a manner to receive the engaging member in a direction which is substantially parallel to a surface of the circuit board.

9. The surface mount coupling device of claim 1 wherein the set of legs is configured to provide a predetermined separation distance between a surface of the circuit board and the body portion.

10. The surface mount coupling device of claim 1 wherein the set of surface mount pads are substantially flat and possess tin material.

11. A surface mount coupling device for coupling an object to a circuit board, the surface mount coupling device comprising:

a set of surface mount pads which is configured to solder to the circuit board using a surface mount soldering process;

a set of legs extending from the set of surface mount pads;

a body portion connected to the set of legs, the body portion providing a fixed structure relative to the circuit board for securing the object when the set of surface mount pads is soldered to the circuit board using the surface mount soldering process, wherein the body portion defines a substantially round socket; and an engaging member which is configured to (i) engage with the body portion through the socket, and (ii) position the object, wherein the engaging member is a plastic clip which is configured to rotate within the socket while remaining engaged with the body portion through the socket.

12. A circuit board assembly, comprising:

a circuit board which defines circuit board pads;

a set of surface mount electronic components soldered to a first set of the circuit board pads using a surface mount soldering process; and a set of surface mount coupling devices soldered to a second set of the circuit board pads using the surface mount soldering process, each surface mount coupling device being configured to couple at least a portion of an object to the circuit board, each surface mount coupling device including (i) a set of surface mount pads connected to the second set of the circuit board pads by solder joints resulting from the surface mount soldering process, (ii) a set of legs extending from the set of surface mount pads, and (iii) a body portion connected to the set of legs, the body portion being substantially planar in shape and being raised above the set of surface mount pads by the set of legs to form a fixed structure for securing the object away from a surface of the circuit board;

wherein, for each surface mount coupling device, the set of leas includes exactly four leas which operate to position the body portion of that surface mount coupling device substantially parallel to the surface of the circuit board, each leg being integral with the body portion of that surface mount coupling device to form a cohesive, unitary member; and wherein for each surface mount coupling device, each leg extends from the body portion of that surface mount coupling device in a substantially straight A-frame manner at an angle that is slightly greater than 90 degrees to provide enhanced stability to the body portion of that surface mount coupling device.

13. The circuit board assembly of claim 12, wherein the set of surface mount coupling devices includes multiple surface mount coupling devices, the multiple surface mount coupling devices being configured to work in tandem to secure, as the object, a single item.

14. The circuit board assembly of claim 12 wherein, for each surface mount coupling device, the body portion of that surface mount coupling device defines a substantially round socket, and wherein each surface mount coupling device further includes an engaging member which is configured to (i) engage with the body portion of that surface mount coupling device through the socket of that surface mount coupling device, and (ii) position the object.

15. A circuit board assembly of claim 12 wherein each circuit board pad of the second set of circuit board pads connects to a ground plane within the circuit board.

16. A circuit board assembly, comprising:

a circuit board which defines circuit board pads;

a set of surface mount electronic components soldered to a first set of the circuit board pads using a surface mount soldering process; and a set of surface mount coupling devices soldered to a second set of the circuit board pads using the surface mount soldering process, each surface mount coupling device being configured to couple at least a portion of an object to the circuit board, each surface mount coupling device including (i) a set of surface mount pads connected to the second set of the circuit board pads by solder joints resulting from the surface mount soldering process, (ii) a set of legs extending from the set of surface mount pads, and (iii) a body portion connected to the set of legs, the body portion providing a fixed structure relative to the circuit board for securing the object;

wherein, for each surface mount coupling device, the body portion of that surface mount coupling device defines a substantially round socket, wherein each surface mount coupling device further includes an engaging member which is configured to (i) engage with the body portion of that surface mount coupling device through the socket of that surface mount coupling device, and (ii) position the object, wherein the object is a cable, and wherein the engaging member of each surface mount coupling device is a clip which is configured to (i) engage the body portion of that surface mount coupling device through the socket of that surface mount coupling device, and (ii) hold a portion of the cable.

17. A circuit board assembly, comprising:

a circuit board which defines circuit board pads;

a set of surface mount electronic components soldered to a first set of the circuit board pads using a surface mount soldering process; and a set of surface mount coupling devices soldered to a second set of the circuit board pads using the surface mount soldering process, each surface mount coupling device being configured to couple at least a portion of an object to the circuit board, each surface mount coupling device including (i) a set of surface mount pads connected to the second set of the circuit board pads by solder joints resulting from the surface mount soldering process, (ii) a set of legs extending from the set of surface mount pads, and (iii) a body portion connected to the set of legs, the body portion providing a fixed structure relative to the circuit board for securing the object;

wherein, for each surface mount coupling device, the body portion of that surface mount coupling device defines a substantially round socket, wherein each surface mount coupling device further includes an engaging member which is configured to (i) engage with the body portion of that surface mount coupling device through the socket of that surface mount coupling device, and (ii) position the object, wherein the object is a fiber optic component, and wherein the engaging member of each surface mount coupling device is a frame which is configured to (i) engage the body portion of that surface mount coupling device through the socket of that surface mount coupling device, and (ii) provide a retaining force on a fiber optic interface of the fiber optic component.

18. A circuit board assembly, comprising:

a circuit board which defines circuit board pads;

a set of surface mount electronic components soldered to a first set of the circuit board pads using a surface mount soldering process; and a set of surface mount coupling devices soldered to a second set of the circuit board pads using the surface mount soldering process, each surface mount coupling device being configured to couple at least a portion of an object to the circuit board, each surface mount coupling device including (i) a set of surface mount pads connected to the second set of the circuit board pads by solder joints resulting from the surface mount soldering process, (ii) a set of legs extending from the set of surface mount pads, and (iii) a body portion connected to the set of legs, the body portion providing a fixed structure relative to the circuit board for securing the object;

wherein, for each surface mount coupling device, the body portion of that surface mount coupling device defines a substantially round socket, wherein each surface mount coupling device further includes an engaging member which is configured to (i) engage with the body portion of that surface mount coupling device through the socket of that surface mount coupling device, and (ii) position the object, wherein the object is a daughter card, and wherein the engaging member of each surface mount coupling device is a screw which is configured to (i) engage the body portion of that surface mount coupling device through the socket of that surface mount coupling device, and (ii) hold a portion of the daughter card in a fixed position relative to the circuit board.

19. A circuit board assembly, comprising:

a circuit board which defines circuit board pads;

a set of surface mount electronic components soldered to a first set of the circuit board pads using a surface mount soldering process; and a set of surface mount coupling devices soldered to a second set of the circuit board pads using the surface mount soldering process, each surface mount coupling device being configured to couple at least a portion of an object to the circuit board, each surface mount coupling device including (i) a set of surface mount pads connected to the second set of the circuit board pads by solder joints resulting from the surface mount soldering process, (ii) a set of legs extending from the set of surface mount pads, and (iii) a body portion connected to the set of legs, the body portion providing a fixed structure relative to the circuit board for securing the object;

wherein, for each surface mount coupling device, the body portion of that surface mount coupling device defines a substantially round socket, wherein each surface mount coupling device further includes an engaging member which is configured to (i) engage with the body portion of that surface mount coupling device through the socket of that surface mount coupling device, and (ii) position the object, wherein the object is a daughter card, and wherein the engaging member of each surface mount coupling device is a standoff which is configured to (i) engage the body portion of that surface mount coupling device through the socket of that surface mount coupling device, and (ii) position the daughter card so that the daughter card is substantially parallel to the circuit board.

* * * * *

UNITED STATES PATENT AND TRADEMARK OFFICE
CERTIFICATE OF CORRECTION

PATENT NO. : 6,924,437 B1
DATED : August 2, 2005
INVENTOR(S) : Creekmore et al.

It is certified that error appears in the above-identified patent and that said Letters Patent is hereby corrected as shown below:

Column 9,
Line 64, "leas" should read -- legs --.

Column 11,
Line 24, "leas" should read -- legs --.

Signed and Sealed this

Twenty-second Day of November, 2005

JON W. DUDAS
*Director of the United States Patent and Trademark Office*